(12) United States Patent  
Qi et al.

(10) Patent No.: US 9,412,797 B2  
(45) Date of Patent: Aug. 9, 2016

(54) ARRAY SUBSTRATE WITH COLOR FILM

(71) Applicant: BOE Technology Group Co., Ltd., Beijing (CN)

(72) Inventors: Yonglian Qi, Beijing (CN); Guanbao Hui, Beijing (CN); Young Suk Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/418,174

(22) PCT Filed: Apr. 22, 2014

(86) PCT No.: PCT/CN2014/075937  
§ 371 (c)(1),  
(2) Date: Jan. 29, 2015

(87) PCT Pub. No.: WO2015/096318  
PCT Pub. Date: Jul. 2, 2015

(65) Prior Publication Data  
US 2015/0340416 A1 Nov. 26, 2015

(30) Foreign Application Priority Data  
Dec. 27, 2013 (CN) .......................... 2013 1 0741603

(51) Int. Cl.  
*H01L 51/52* (2006.01)  
*H01L 27/32* (2006.01)  
(Continued)

(52) U.S. Cl.  
CPC ............ *H01L 27/3248* (2013.01); *H01L 21/77* (2013.01); *H01L 27/12* (2013.01); *H01L 27/322* (2013.01); *H01L 51/5206* (2013.01); *H01L 51/5215* (2013.01); *H01L 51/5284* (2013.01);

(Continued)

(58) Field of Classification Search  
CPC . H01L 27/3248; H01L 51/5215; H01L 51/56; H01L 51/5284  
See application file for complete search history.

(56) References Cited  
U.S. PATENT DOCUMENTS  
5,706,064 A * 1/1998 Fukunaga ......... G02F 1/136286  
349/106

FOREIGN PATENT DOCUMENTS  
CN 1438709 A 8/2003  
CN 1204628 C 6/2005  
(Continued)

OTHER PUBLICATIONS  
International Search Report and Written Opinion (in Chinese) for PCT Application No. PCT/CN2014/075937, dated Sep. 19, 2014, 10 pages.  
(Continued)

*Primary Examiner* — Mamadou Diallo  
(74) *Attorney, Agent, or Firm* — Westman, Champlin & Koehler, P.A.

(57) ABSTRACT

An embodiment of the present invention relates to a technical field of display and provides an array substrate and a method for producing the same and a display apparatus that may simplify the layer arrangements and producing process of the array substrate, reduce the difficulty for producing the array substrate and improve the product yield of the array substrate. The array substrate comprises: a substrate base; and a thin film transistor unit and a color film on the substrate base, wherein the color film is conductive and electrically connected with a drain electrode of the thin film transistor unit.

14 Claims, 7 Drawing Sheets

(51) Int. Cl.
    *H01L 51/56*     (2006.01)
    *H01L 21/77*     (2006.01)
    *H01L 27/12*     (2006.01)

(52) U.S. Cl.
    CPC ........... *H01L 51/56* (2013.01); *H01L 2227/323* (2013.01)

(56) References Cited

FOREIGN PATENT DOCUMENTS

| CN | 101681926 A | 3/2010 |
|----|-------------|--------|
| CN | 201876644 U | 6/2011 |
| CN | 103474578 A | 12/2013 |
| CN | 103715204 A | 4/2014 |

OTHER PUBLICATIONS

First Office Action, including Search Report, for Chinese Patent Application No. 201310741603.2, dated Sep. 17, 2014, 11 pages.

English translation of Box No. V of the Written Opinion for the International Searching Authority for International Application No. PCT/CN2014/075937, 2 pages.

\* cited by examiner

Fig.6 forming a pattern comprising a drain electrode of a thin film transistor unit and a color film contacting with the drain electrode — S101

ARRAY SUBSTRATE WITH COLOR FILM

CROSS-REFERENCE TO RELATED APPLICATION

This application is a Section 371 National Stage application of International Application No. PCT/CN2014/075937, filed 22 Apr. 2014, which has not yet published, which claims priority to Chinese Patent Application No. 201310741603.2, filed 27 Dec. 2013, in Chinese, the contents of which are hereby incorporated by reference in their entirety.

BACKGROUND OF THE INVENTION

1. Field of the Invention

The present disclosure relates to the technical field of display, more particularly, relates to an array substrate, a method for producing the array substrate and a display apparatus.

2. Description of the Related Art

An organic light emitting diode (OLED) is an organic thin film electroluminescent device, which has advantages such as simple production process, low costs, high light emitting efficiency, easy production of flexible structures, wide views. Thus, the display technology for the organic light emitting diode has been one important display technology.

As the technology for white organic light emitting diode (WOLED) has refined and has a good stability and simple production process, it has been widely applied in display apparatuses. In order to achieve colored display of the WOLED, a color film (also called as a color filter) is needed. In a WOLED display apparatus, each of the minimum pixel points that are visible from the external (that is, "visible pixels") is composed of a plurality of pixel units. Each of the pixels has a color film with different colors such that the lights emitted from the WOLED for different pixel units can have different colors through the color film. These lights with different colors may be mixed into the light emitted from the visible pixel.

The inventors have discovered that the WOLED comprises a metal anode, a conductive layer, an organic light emitter between the metal anode and the conductive layer. Thus, in addition to various layers of a thin film transistor, an array substrate further comprises various layers of the WOLED and the color film. However, it may increase the complication of arrangement of layers of the array substrate and difficulty for producing the array substrate and reduce the yield of the array substrate.

SUMMARY OF THE INVENTION

The object of the present invention is to solve at least one aspect of the above issues and defects in the prior art.

The technical problem of the present invention is to provide an array substrate and a method for producing the same and a display apparatus that may simplify the layer arrangements and producing process of the array substrate, reduce the difficulty for producing the array substrate and improve the product yield of the array substrate.

In order to achieve the above object, the present invention may be implemented as the following embodiments.

According to the first aspect of the present disclosure, it provides an array substrate, comprising: a substrate base; and a thin film transistor unit and a color film on the substrate base, wherein the color film is conductive and electrically connected with a drain electrode of the thin film transistor unit.

According to an exemplified embodiment, the array substrate may further comprise: a first insulation layer between the color film and the drain electrode of the thin film transistor unit, wherein a first via hole is formed in a region of the first insulation layer corresponding to the drain electrode of the thin film transistor unit, and wherein the color film is electrically connected with the drain electrode through the first via hole.

According to another exemplified embodiment, the array substrate may further comprise: an organic layer and a conductive layer on the color film, wherein the color film in combination with the conductive layer drives the organic layer to emit a light.

According to another exemplified embodiment, the array substrate may further comprise: a second insulation layer on the color film, wherein the second insulation layer is provided with an opening thereon, the organic layer being electrically connected with the color film through the opening.

According to another exemplified embodiment, the array substrate may further comprise: a common electrode cooperating with the color film; and a third insulation layer between the color film and the common electrode.

According to another exemplified embodiment, the color film is made from transparent conductive material.

According to another exemplified embodiment, the color film is made of transparent conductive resin.

According to another exemplified embodiment, the color film is separated electrically into a plurality of parts corresponding to pixel units respectively.

According to another exemplified embodiment, the plurality of parts of the color film corresponding to pixel units respectively are insulated electrically by an insulation layer.

According to another exemplified embodiment, the insulation layer is a black matrix.

In the technical solutions of the embodiment of the present invention, by means of the COA technology, the color film and the thin film transistor unit are both on the same substrate base and the conductive color film is electrically connected with the drain electrode of the thin film transistor unit such that the color film is equivalent to the pixel electrode in the prior art. In this way, the array substrate at least removes a layer of pixel electrode compared with the one in the prior art. It may simplify the layer arrangement of the array substrate, reduce the difficulty of producing the array substrate and further improve the yield of the array substrate.

The second aspect of the present invention provides a display apparatus comprising an array substrate as described above.

The third aspect of the present invention provides a method for producing an array substrate, comprising: forming a pattern comprising a drain electrode of a thin film transistor unit and a conductive color film electrically connected with the drain electrode.

According to an exemplified embodiment, forming a pattern comprising a drain electrode of a thin film transistor unit and a conductive color film electrically connected with the drain electrode comprises: forming the pattern comprising the drain electrode of the thin film transistor unit; and forming the color film on the formed drain electrode of the thin film transistor unit, the color film being electrically connected with the drain electrode of the thin film transistor unit.

According to another exemplified embodiment, forming a pattern comprising a drain electrode of a thin film transistor unit and a conductive color film electrically connected with the drain electrode comprises: forming the color film; and forming the pattern comprising the drain electrode of the thin film transistor unit on the color film, the color film being electrically connected with the drain electrode of the thin film transistor unit.

According to another exemplified embodiment, the method further comprise, before forming the color film on the drain electrode of the thin film transistor unit, forming a first insulation layer on the formed drain electrode of the thin film transistor unit and forming a first via hole in a region of the first insulation layer corresponding to the drain electrode of the thin film transistor unit, wherein the color film is electrically connected with the drain electrode through the first via hole.

According to another exemplified embodiment, the method further comprises, before forming the drain electrode of the thin film transistor unit on the color film, forming a first insulation layer on the color film and forming a first via hole in a region of the first insulation layer corresponding to the drain electrode of the thin film transistor unit, wherein the color film is electrically connected with the drain electrode through the first via hole.

According to another exemplified embodiment, the method further comprises: forming an organic layer on the formed color film and forming a conductive layer on the organic layer, wherein the color film contacts with the organic layer, and wherein the color film drives the organic layer to emit a light in combination with the conductive layer.

According to another exemplified embodiment, the method further comprises, before forming the organic layer on the color film, forming a second insulation layer on the color film and forming an opening on the second insulation layer, wherein the organic layer is electrically connected with the color film through the opening.

BRIEF DESCRIPTION OF THE DRAWINGS

The above and other features of the present invention will become more apparent by describing in detail exemplary embodiments thereof with reference to the accompanying drawings. The skilled person in the art would appreciate that the following drawings only shows some embodiments of the present invention, but the present invention is not limited to these drawings by any way.

REFERENCE NUMERALS

1—substrate base
2—thin film transistor unit
21—gate electrode
22—gate insulation layer
23—active layer
24—source electrode
25—drain electrode
3—color film
4—organic layer
5—conductive layer
6—first insulation layer
7—first via hole
8—second insulation layer
9—opening
10—black matrix
11—third insulation layer
12—fourth insulation layer
13—common electrode

DETAILED DESCRIPTION OF PREFERRED EMBODIMENTS OF THE INVENTION

Exemplary embodiments of the present disclosure will be described hereinafter in detail with reference to the attached drawings. Apparently, the disclosed embodiments are only part of those of the present invention, instead of all of embodiments. In view of these embodiments of the present invention, the skilled person in the art may envisage other embodiments without inventive labors. All of the other embodiments also fall within scope of the present invention.

Embodiment 1

Figure 1:
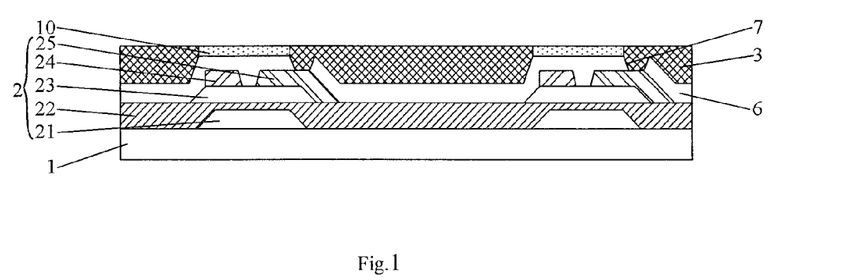
FIG. 1 is a first schematic view of a structure of an array substrate according to an embodiment of the present invention.

An embodiment of the present invention provides an array substrate. As illustrated in FIG. 1, the array substrate comprises a substrate base 1 and a thin film transistor unit 2 and a color film 3 on the substrate base 1. The color film 3 is electrically connected with a drain electrode 25 of the thin film transistor unit 2. The color film 3 is conductive.

The thin film transistor unit 2 may achieve transmission of electrical signals between its source electrode 23 and drain electrode 25 mainly by forming conducting channel in an active layer 24. However, light irradiation may degrade the capacity of transporting carriers of the conducting channel in the active layer and thus reduce the effects of the working of the thin film transistor unit 2. Typically, it is desired to provide a black matrix 10 corresponding to the active layer 23 of the thin film transistor unit.

The black matrix may be produced by black or dark resin. In the process producing the black matrix 10, at first, a layer of masking material is deposited on a passivation layer, and then a plurality of black matrixes 10 corresponding to the respective thin film transistor units 2 by patterning. In order to simplify the process for producing the array substrate, preferably, the black matrix is made from black photo resist. By means of the photosensitive property of the photo resist, use of the photo resist may be omitted in producing the black matrix 10.

The patterning means any process that may form a desired pattern. It generally includes part or all of processes of coating the photo resist, exposure, development, etching, peeling off the photo resist, or may be more other patterning means such as printing, pressing.

As the people is eager to the display apparatus with high performance such as for transmittance, resolution, power assumption recently, the display apparatus is developing towards the objects of such as high transmittance, high resolution, low power assumption. The higher the resolution becomes, the smaller the size of each pixel unit. When the length of each side of the pixel unit becomes between ten and twenty micrometers from dozens of micrometers, obviously, the size of the pixel unit will be reduced significantly. At this time, if the width of black matrix dividing the pixel units is still maintained, the black matrix will become clear with respect to the pixel unit, which may influence the display effects of the display apparatus. Thus, the width of the black matrix should be reduced at a certain extent such that the display apparatus can have a desired display effect. Then, the color film is formed on a display region surrounded by the black matrix corresponding to the pixel unit.

However, the reduction of width of the black matrix may cause the deviation of alignment between the array substrate and the color film substrate and thus lead to undesired effects, such as light leak. Therefore, the width of the black matrix on the color film substrate cannot be reduced arbitrarily. In order to avoid the undesired effects such as light leak, due to reduction of black matrix, the black matrix and the color film may be moved onto the array substrate. In this way, the black matrix is located on the array substrate, thus, even if the width of the black matrix is reduced slightly, the black matrix can mask the structures that need to be masked, such as gate lines, data lines and thin film transistor unit sufficiently while reducing the probability of light leak. Thus, the display apparatus may have a desired effect while improving resolution and transmittance. Such technology is called as COA (Color Filter on Array) technology.

In an embodiment of the present invention, the COA technology is used. The color film 3 and the thin film transistor unit 2 are both formed on the same substrate base 1 and the conductive color film 3 is electrically connected with the drain electrode 25 of the thin film transistor unit 2 such that the color film 3 corresponds to the pixel electrode in the prior art. In this way, the array substrate at least removes a layer of pixel electrode compared with the one in the prior art. It may simplify the layer arrangement of the array substrate, reduce the difficulty of producing the array substrate and further improve the yield of the array substrate.

It should be noted that since the color film 3 in the embodiment of the present invention is conductive, the color film 3 between the respective pixel units needs to be insulated. In particular, it may be achieved by an insulated black matrix 10 or other means. However, the embodiments of the present invention are not limited by this. In addition, the color film 3 and the drain electrode of the thin film transistor unit 2 may be in direct contact with each other such that they are electrically connected. Certainly, the color film 3 may be located on or below the drain electrode of the thin film transistor unit 2.

As illustrated in FIG. 1, besides the color film 3 and the thin film transistor unit 2, the array substrate further includes a first insulation layer 6 between the color film 3 and the drain electrode 25 of the thin film transistor unit 2. A first via hole 7 is formed in a region of the first insulation layer 6 corresponding to the drain electrode 25 of the thin film transistor unit 2. The color film 3 is electrically connected with the drain electrode 25 through the first via hole 7.

Obviously, the thin film transistor unit 2 in the array substrate illustrated in FIG. 1 is bottom gate type, that is, the thin film transistor unit 2 includes, from the bottom to the top: a gate electrode 21, a gate insulation layer 22, a source electrode 24 and the drain electrode 25 located on the same layer and insulated, and an active layer 23 connecting the source electrode 24 with the drain electrode 25.

In FIG. 1, the color film 3 is located on the thin film transistor unit 2, thus, the first insulation layer 6 is located on the thin film transistor unit 2. At this time, the first insulation layer 6 is often called as a passivation layer. The process of the passivation layer may not only improve the capacity of environmental resistance for the display apparatus, but also may improve the photo parameter performance of the thin film transistor unit 2. However, the passivation layer typically uses insulation materials such as silicon oxide, silicon nitride, hafnium nitride, resin. In order to achieve the electrical connection between the color film 3 and the drain electrode 25, the region of the first insulation layer 6 corresponding to the drain electrode 25 of the thin film transistor unit 2 may be provided with the first via hole 7 through the first insulation layer 6, such that the color film 3 can be electrically connected with the drain electrode 25 through the first via hole 7.

Although the present disclosure explains the embodiments with reference to the bottom gate type thin film transistor, the present invention is not limited to this. For example, the embodiments of the present invention include top gate type thin film transistor. The bottom gate type thin film transistor should be interpreted as a collective term of bottom gate thin film transistors. So called bottom gate thin film transistor is one type thin film transistor in which the gate of the thin film transistor is located below the semiconductor layer of the thin film transistor. On basis of the same ground, the top gate type thin film transistor should be interpreted as a collective term of top gate thin film transistors. So called top gate thin film transistor is one type thin film transistor in which the gate of the thin film transistor is located on the semiconductor layer of the thin film transistor.

Figures 2, 3:
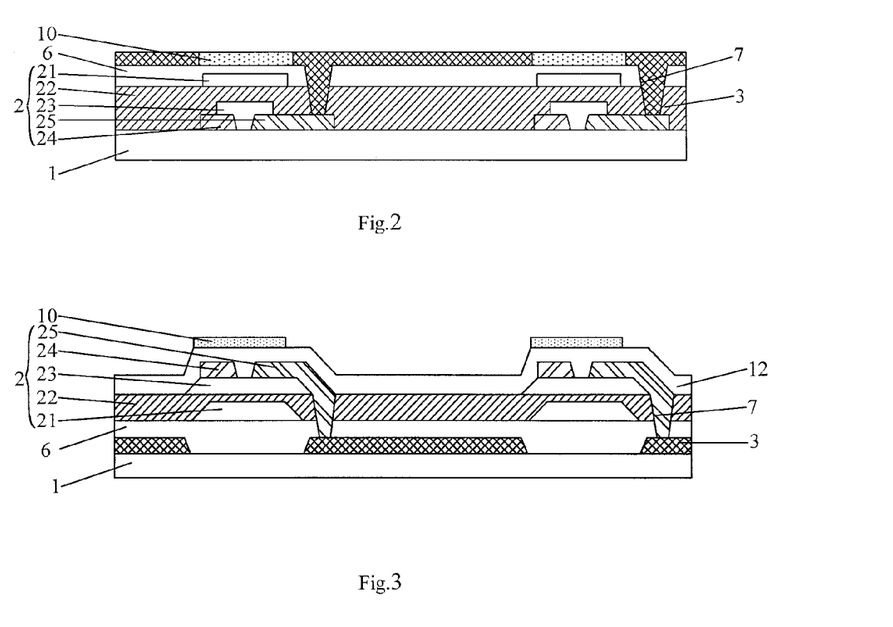
FIG. 2 is a second schematic view of a structure of an array substrate according to an embodiment of the present invention.
FIG. 3 is a third schematic view of a structure of an array substrate according to an embodiment of the present invention.

For example, the thin film transistor unit 2 also may be of top gate type as illustrated in FIG. 2. The top gate type thin film transistor unit 2 has the structure which is almost opposite to that of the bottom gate type thin film transistor unit shown in FIG. 1, that is, the top gate type thin film transistor unit includes, from the bottom to the top: a source electrode 24 and the drain electrode 25 located on the same layer and insulated, an active layer 23 connecting the source electrode 24 with the drain electrode 25, a gate insulation layer 22 and a gate electrode 21.

In FIG. 2, in order to achieve the contact between the color film 3 and the drain electrode 25, a first via hole 7 may provided in the regions of the first insulation layer 6 and the gate insulation layer 22 corresponding to the drain electrode 25 of the thin film transistor unit 2. That is, the first via hole 7 in this circumstance needs passes through two insulation layers, i.e., the first insulation layer 6 and the gate insulation layer 22 such that the color film 3 can be electrically connected with the drain electrode 25 through the first via hole 7.

It should be noted that in the arrangement of the array substrate in FIG. 1 or FIG. 2, the color films 3 corresponding to the respective pixel units may be insulated directly by the black matrix 10, or may be insulated by providing an additional insulation layer on the black matrix 10.

Further, as illustrated in FIG. 3, the color film 3 may also be located below the thin film transistor unit 2 if the thin film transistor unit 2 is of bottom gate type. Obviously, in this case, the drain electrode 25 of the bottom gate type thin film transistor unit 2 is located in the uppermost layer of the entire stack of the thin film transistor unit 2. In order to achieve the contact between the drain electrode 25 and the color film 3, the first via hole 7 must at least pass through the first insulation layer 6 and the gate insulation layer 22 such that the color film 3 and the drain electrode 25 can be electrically connected with each other.

Figure 4:
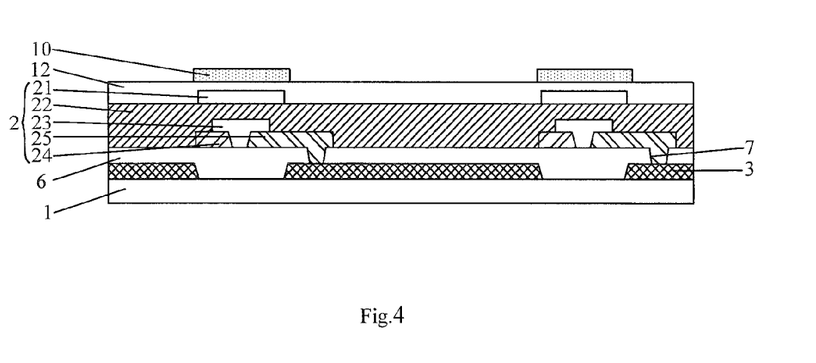
FIG. 4 is a fourth schematic view of a structure of an array substrate according to an embodiment of the present invention.

Or, as illustrated in FIG. 4, the color film 3 is also located below the thin film transistor unit 2 and the thin film transistor unit 2 is of top gate type. Obviously, in this circumstance, the drain electrode 25 of the top gate type thin film transistor unit 2 is located in the lowermost layer of the entire stack of the thin film transistor unit 2, thus, the first via hole 7 only needs to pass through the first insulation layer 6 so as to achieve the electrical connection between the drain electrode 25 and the color film 3.

Obviously, in consideration of difficulty of producing the first via hole 7, the first via hole 7 in the array substrate shown in FIG. 1 or FIG. 4 is easy to be produced. However, the array substrate shown in FIG. 4 cannot use the first insulation layer 6 between the color film 3 and the thin film transistor unit 2 as the passivation layer as the color film 3 is located below the thin film transistor unit 2. It must additionally form a fourth insulation layer 12 as the passivation layer such that the array substrate shown in FIG. 4 has more layers than that shown in FIG. 1. Thus, in an embodiment of the present invention, preferably, the array substrate shown in FIG. 1 is used.

Similar to FIG. 4, the array substrate shown in FIG. 3 also has the fourth insulation layer 12 as the passivation layer. The fourth insulation layers 12 shown in FIG. 3 and FIG. 4 may be made from insulation materials such as silicon oxide, silicon nitride, hafnium nitride, resin.

Obviously, in the arrangements in FIG. 3 and in FIG. 4, the first insulation layer 6 may be used to insulate the color film 3 corresponding to the respective pixel units.

It should be noted that in an embodiment of the present invention, the source electrode 24 and the drain electrode 25 of the thin film transistor unit 2 are arranged on the same layer and formed by the same patterning process. However, the thin film transistor unit 2 with the source electrode 24 and the drain electrode 25 arranged in different layers are also suitable to the embodiment of the present invention.

It should be noted that as the arrangements shown in FIGS. 1-4 have certain similarity, the array substrate will be described below with reference to the array substrate shown in FIG. 1.

Figure 5:
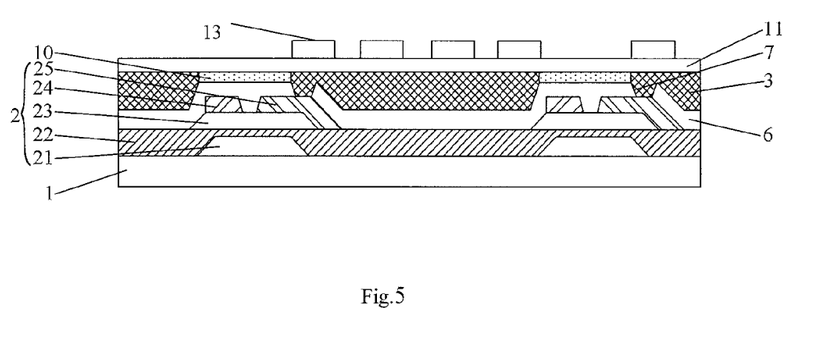
FIG. 5 is a fifth schematic view of a structure of an array substrate according to an embodiment of the present invention.

As discussed above, as the color film 3 is conductive, e.g., made from transparent conductive material and is electrically connected with the drain electrode 25 of the thin film transistor unit 2, the color film 3 also corresponds to the pixel electrode (corresponding to plate electrode) in the prior art. Obviously, the array substrates shown in FIGS. 1-4 are COA-processed twisted nematic (TN) mode array substrates. In view of this, the array substrate shown in FIG. 1 may be improved, for example, as illustrated in FIG. 5, the array substrate further includes a common electrode 13 (corresponding to slit electrode) cooperating with the color film 3 and a third insulation layer 11 between the color film 3 and the common electrode 13 on basis of the array substrate shown in FIG. 1. In this circumstance, the array substrate is a COA-processed advanced super dimension switch (ADS) mode array substrate.

So called advanced super dimension switch, abbreviated as ADS has the following kernel technical feature: forming multidimensional electrical field by an electrical field produced at slit electrode edge in the same plane and an electrical field produced between the slit electrode layer and the plate electrode layer such that the liquid crystal molecules with all of orientations right on the electrodes and between silt electrodes can rotate so as to improve the work efficiency of the liquid crystal and improve the transimissivity efficiency. The advanced super dimension switch may improve image quality of TFT-LCD productions, and have advantages such as high resolution, high transmittance, low power assumption, wide view, high aperture opening rate, low chromatic aberration and no push Mura. For different applications, the improved ADS includes high transmittance I-ADS, high aperture opening rate H-ADS and high resolution S-ADS, and the like.

The skilled person in the art would appreciate that the common electrode in the above embodiments may be plate-shaped or slit-shaped. So the pixel electrodes do. Of course, the sequence of the pixel electrode and the common electrode may be reversible, and they may both be slit electrodes.

Certainly, the array substrate in the embodiment is also suitable for In-Plane Switch (IPS). IPS has the following technical feature: forming a horizontal electrical field produced by a slit common electrode and a slit pixel electrode in the same plane. For example, a part of the conductive color film in the same layer is used as the pixel electrode and another part is used as the common electrode.

Figure 6:
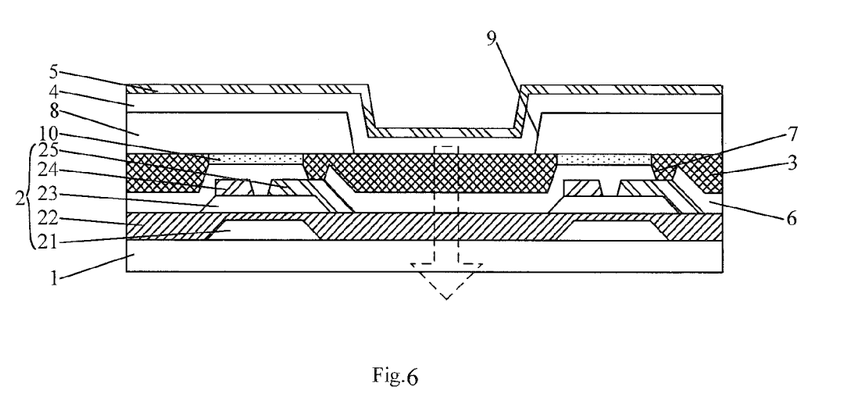
FIG. 6 is a sixth schematic view of a structure of an array substrate according to an embodiment of the present invention.

Similarly, the common electrode 13 cooperating with the color film 3 and the third insulation layer 11 between the color film and the common electrode 13 may be added on the array substrate shown in FIGS. 2-4. Or, in additional to the array substrate in FIG. 1, as shown in FIG. 6, the array substrate further includes an organic layer 4 and a conductive layer 5 on the color film 3. The color film 3 drives the organic layer 4 to emit a light in combination with the conductive layer 5, that is, such array substrate is an organic light emitting diode (OLED) mode array substrate.

In the array substrate shown in FIG. 6, as the color film 3 is conductive and electrically connected with the drain electrode 25 of the thin film transistor unit 2, that is, the color film 3 corresponds to the metal anode of the organic layer 4 in the prior art. Thus, in the array substrate, the layer of metal anode may be omitted. Meanwhile, the planarization layer between the metal anode and the color film 3 in the prior art is also omitted. Thus, the array arrangement of the OLED mode array substrate may be simplified significantly. And as the layer arrangement of the OLED mode array substrate is simplified, its processing flows and processing difficulty will be reduced, so as to improve the production yield of the OLED mode array substrate.

Similarly, the common electrode 13 located on the color film 3 may be added on the array substrate shown in FIGS. 2-4, so as to form ADS mode array substrate. Its details will be omitted below.

Generally, the OLED mode array substrate has a light emitting direction indicated by dashed arrows in FIG. 6. The light is emitted from the organic layer 4 and exits the substrate base 1 through the stack arrangement.

The organic layer 4 may preferably be made from materials that can emit a white light. Thus, in the embodiment of the present invention, the conductive layer 5 driving the organic layer 4 to emit the light in combination with the color film 3 is preferably made from low cost and opaque materials such as aluminium. The light emitted from the organic layer 4 may be reflected into the color film 3 to improve utilization of the light emitted from the organic layer 4. Also, the light emitted from the organic layer 4 may be prevented from changing colors after being reflected by the conductive layer such that the display apparatus may have a desired display effect.

In addition, as all of parts on the entire array substrate do not emit the light towards an observer in work, the second insulation layer 8 may be provided on the region which does not need to emit the light (for example, the region corresponding to the thin film transistor unit 2, overlaying region of the black matrix 10) on the color film 3 to insulate the color film 3 from the organic layer 4 such that the organic layer 4 on the region can be prevented from emitting the light. In contrast, in the region that needs to emit the light, that is, the sub-pixel region, an opening 9 is provided on the second insulation layer 8 such that the organic layer 4 can contact with the color film 3 though the opening 9. Since the second insulation layer 8 may define the light exiting region, that is, define the sub-pixel region, the second insulation layer 8 is typically called as a pixel definition layer. In this way, the region corresponding to the opening 9 is a light emitting region while the region overlaid by the second insulation layer 8 does not emit the light.

Similar to the first insulation layer 6 and the third insulation layer 11, the second insulation layer 8 may also be made from insulation materials such as silicon oxide, silicon nitride, hafnium nitride, resin.

In an embodiment of the present invention, the color film 3 not only needs good conductive effects, but also needs properties such as relatively high color gamut, phototonus, solidification, transmittance. For example, when the color film is used as an OLED anode, it not only meets the requirement of transmittance (or filtering), but also has a work function matched with the organic layer. Therefore, the color film 3 is preferably made from the transparent conductive resin.

The transparent conductive resin should be interpreted as a collective term of the resin having properties of light transmission (or light filtering) and conduction. For example, pigments with corresponding colors are doped in the process of producing the transparent conductive resin, or conductive materials are doped in the process of producing the color film resin. Specifically, the transparent conductive resin may be produced by the following steps:

adding 10~50 phr transparent base resin and 1~20 phr polyaniline doped with organic acid into 40~90 phr toluene and mixing them to be solved completely to form the transparent conductive resin;

or adding 10~50 phr transparent base resin, 1~20 phr polyaniline doped with organic acid and 1~15 phr crosslinking monomer into 40~90 phr toluene and mixing them to be solved completely to form the transparent conductive resin;

or adding 10~50 phr transparent base resin, 1~20 phr polyaniline doped with organic acid, 1~15 phr crosslinking monomer and 0.1~1 phr solidifying initiator into 40~90 phr toluene and mixing them to be solved completely to form the transparent conductive resin.

After the transparent conductive resin has been prepared, it only needs to dope the corresponding pigments into it, that is, the color film may be formed by the transparent conductive resin with pigments.

Alternatively, the transparent conductive resin for producing the color film 3 may be produced by mixing nanoscale $SnO_2$ doped with antimony with pigments, light initator, high molecular polymer monomer, dispersant agent, surface active agent and so on.

Besides the nanoscale $SnO_2$ doped with antimony, the conductive particles may be nanoscale conductive particles such as nanoscale ITO or nano-silver. Generally, the conductive particles may have sizes of 20-50 nm.

In addition, the electrical resistivity of the resultant color film 3 may be changed by regulating the factors such as curing temperature of the resin, sizes of the conductive particles, light irradiation such that the color film 3 may provide a good contact between the drain electrode 25 and the organic layer 4.

Further, an embodiment of the present invention also provides a display apparatus comprising the array substrate as described in any of the above embodiments. In particular, the display apparatus may be any products or components having display function, for example, a liquid crystal panel, an electronic paper, an OLED panel, a liquid crystal TV, a liquid crystal display, a digital photo frame, a cell phone or a tablet computer.

Embodiment 2

Figure 7:
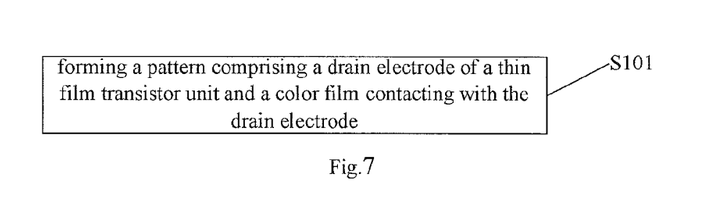
FIG. 7 schematically shows a first flow chart of a method for producing an array substrate according to an embodiment of the present invention.

An embodiment of the present invention provides a method for producing an array substrate disclosed. As illustrated in FIG. 7, the method includes:

Step S101 of forming a pattern comprising a drain electrode of a thin film transistor unit and a conductive color film electrically connected with the drain electrode.

Figure 8:
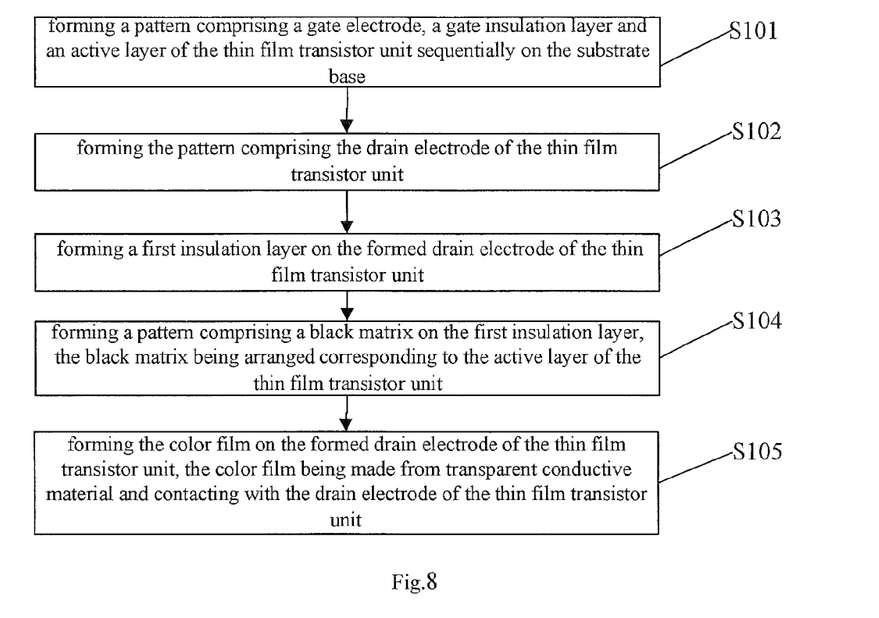
FIG. 8 schematically shows a second flow chart of a method for producing an array substrate according to an embodiment of the present invention.

Thereby, the array substrate in which the color film and the drain electrode are electrically connected with each other, as shown in FIGS. 1-4, may be produced. In particular, from the above Embodiment 1, the array substrate provided by the embodiments of the present invention at least has four structures as shown in FIGS. 1-4, that is, the drain electrode of the thin film transistor unit may be on the color film or below the color film, and the thin film transistor unit may be of bottom gate type or be of top gate type. As an example, if it is desired to produce the array substrate shown in FIG. 1, as illustrated in FIG. 8, the Step S101 in particular includes:

Step S201 of forming a pattern comprising a gate electrode, a gate insulation layer and an active layer of the thin film transistor unit sequentially on the substrate base.

Figure 9:
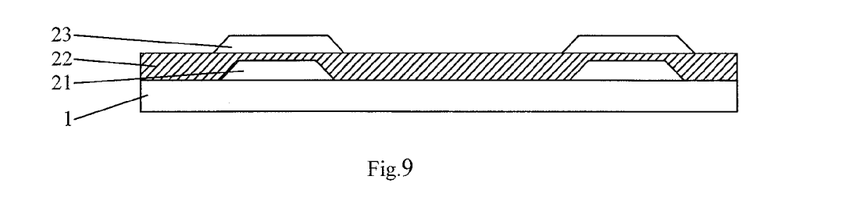
FIG. 9 is a seventh schematic view of a structure of an array substrate according to an embodiment of the present invention.

As illustrated in FIG. 9, the thin film transistor unit 2 includes, from the bottom to the top, the gate electrode 21, the gate insulation layer 22 located on the gate electrode 21 and the active layer 23 located on the gate insulation layer 22. Thus, in producing the thin film transistor unit 2, the gate electrode 21, the gate insulation layer 22 and the active layer 23 are formed sequentially on the array substrate.

It should be noted that while the gate electrode of the thin film transistor unit is formed, structures such as gate lines (not shown) on the substrate base are also integrally molded.

Step S202 of forming the pattern comprising the drain electrode of the thin film transistor unit.

The drain electrode 25 of the thin film transistor unit is located on the active layer 23. Besides the on structures such as the gate electrode 21, the gate insulation layer 22, the active layer 23 and the drain electrode 25, the thin film transistor unit 2 further includes a source electrode 24. In an embodiment of the present invention, the source electrode 24 and the drain electrode 25 of the thin film transistor unit 2 are provided on the same layer. Thus, it may be considered to form the source electrode 24 while forming the drain electrode 25 in the Step S202, as shown in FIG. 10.

If the source electrode 24 and the drain electrode 25 are arranged in different layers, it may be considered to form the source electrode 24 before or after forming the drain electrode 25. The embodiments of the present invention are not limited to this.

Step S203 of forming a first insulation layer on the formed drain electrode of the thin film transistor unit.

Figure 10:
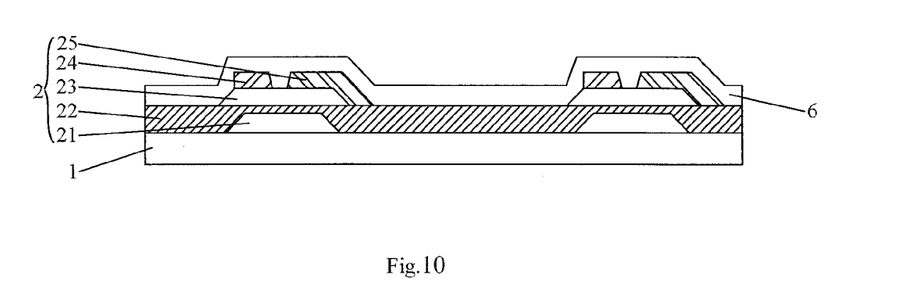
FIG. 10 is an eighth schematic view of a structure of an array substrate according to an embodiment of the present invention.

Based on the FIG. 10 corresponding to the Step S202, the first insulation layer 6 is formed on the drain electrode of the thin film transistor unit by means such as coating, depositing. Thus, the first insulation layer 6 is located on the thin film transistor unit 2. In this case, the first insulation layer 6 is typically called as the passivation layer. The process of the passivation layer may not only improve the capacity of environmental resistance for the display apparatus, but also may improve the photo parameter performance of the thin film transistor unit 2. However, the passivation layer typically uses insulation materials such as silicon oxide, silicon nitride, hafnium nitride, resin.

Step S204 of forming a pattern comprising a black matrix on the first insulation layer, the black matrix being arranged corresponding to the active layer of the thin film transistor unit.

Figure 11:
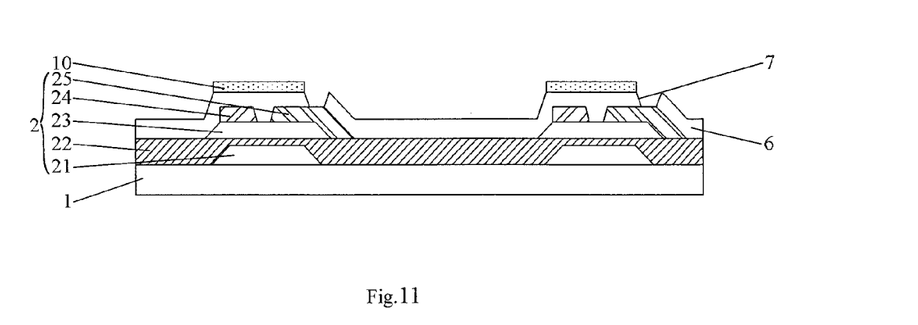
FIG. 11 is a ninth schematic view of a structure of an array substrate according to an embodiment of the present invention.

A layer of masking material is formed on the pattern formed on the first insulation layer 6 by forms of such as coating or depositing, and then a plurality of black matrixes 10 corresponding to the active layers 23 of the respective thin film transistor units 2 are formed by patterning including etching, as shown in FIG. 11. In order to simplify the process of producing the array substrate, they are preferably made from black photo resist. By means of the photosensitive property of the photo resist, use of the photo resist may be omitted in producing the black matrix 10.

It should be noted that the black matrix 10 typically covers the entire active layer 23 such that conducting channels formed in the active layer 23 are not irradiated by the light when the thin film transistor unit 2 works.

Further, after the black matrix 10 has been formed, a first via hole 7 is also provided by patterning in the region corresponding to the drain electrode 25 of the thin film transistor unit 2, as illustrated in FIG. 11, such that the color film 3 and the drain electrode 25 can be connected efficiently with each other. Although the first insulation layer 6 may be made from insulation materials such as silicon oxide, silicon nitride, hafnium nitride, resin, it may preferably be made from photo resist because the first insulation layer 6 may be patterned to form the first via hole 7. By means of the photosensitive property of the photo resist, use of the photo resist may be omitted in producing the first via hole 7.

Step S205 of forming the color film on the formed drain electrode of the thin film transistor unit, the color film being electrically connected with the drain electrode of the thin film transistor unit.

Figure 12:
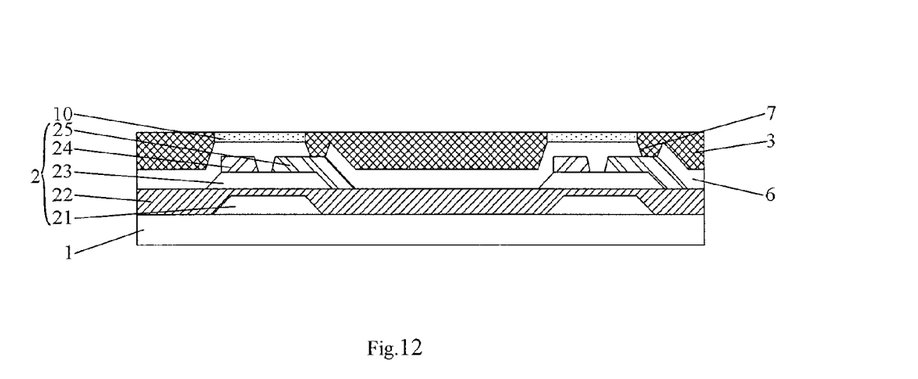
FIG. 12 is a tenth schematic view of a structure of an array substrate according to an embodiment of the present invention.

As illustrated in FIG. 12, based on the Step S204, the color film is formed on the drain electrode of the resultant thin film transistor unit. The color film 3 may be electrically connected with the drain electrode 25 of the thin film transistor unit 2 through the first via hole 7 of the first insulation layer 6.

In order to ensure that the color film 3 not only has good conducting performance, but also has properties such as relatively high color gamut, phototonus, solidification, transmittance. In an embodiment of the present invention, preferably, the color film 3 is made from the transparent conductive resin. In particular, the transparent conductive resin may be produced by the following method:

adding 10~50 phr transparent base resin and 1~20 phr polyaniline doped with organic acid into 40~90 phr toluene and mixing them to be solved completely to form the transparent conductive resin;

or adding 10~50 phr transparent base resin, 1~20 phr polyaniline doped with organic acid and 1~15 phr crosslinking monomer into 40~90 phr toluene and mixing them to be solved completely to form the transparent conductive resin;

or adding 10~50 phr transparent base resin, 1~20 phr polyaniline doped with organic acid, 1~15 phr crosslinking monomer and 0.1~1 phr solidifying initiator into 40~90 phr toluene and mixing them to be solved completely to form the transparent conductive resin.

After the transparent conductive resin has been prepared, it only needs to dope the corresponding pigments into it, that is, the color film may be formed by the transparent conductive resin with pigments.

As an example, the transparent conductive resin for producing the color film 3 may be produced by mixing nanoscale conductive particles and pigments, light initiator, high molecular polymer monomer, dispersant agent, surface active agent and so on and then by such as coating or depositing means.

Besides the nanoscale $SnO_2$ doped with antimony, the conductive particles may be nanoscale conductive particles such as nanoscale ITO or nano-silver.

As discussed above, as the color film 3 is connected with the drain electrode 25 of the thin film transistor unit 2 and made from the transparent conductive material, the color film 3 is equivalent to the pixel electrode in the prior art. Obviously, the array substrate shown in FIG. 1 is an array substrate in a COA-processed twisted nematic (TN) mode display panel. In view of this, the array substrate shown in FIG. 1 may be improved, for example, as illustrated in FIG. 5, the array substrate further includes a common electrode 13 cooperating with the color film 3 and a third insulation layer 11 between the color film 3 and the common electrode 13 on basis of the array substrate shown in FIG. 1. In this circumstance, the array substrate is an array substrate in a COA-processed advanced super dimension switch (ADS) mode display panel.

Figure 13:
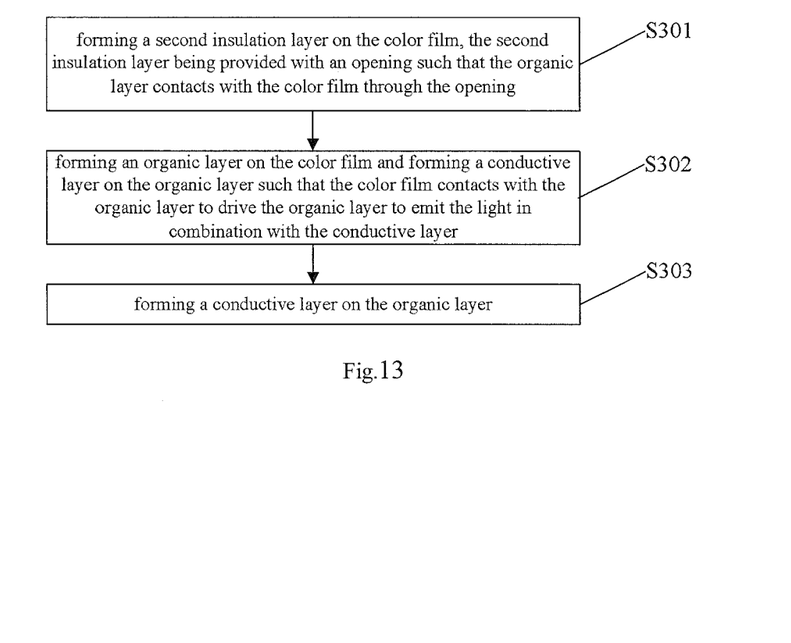
FIG. 13 schematically shows a third flow chart of a method for producing an array substrate according to an embodiment of the present invention.

Further, the array substrate in an organic light-emitting diode (OLED) display panel is formed on the basis of technical solution shown in FIG. 1. In particular, as shown in FIG. 13, the Step S205 then further includes:

Step S301 of forming a second insulation layer on the color film, the second insulation layer being provided with an opening such that the organic layer is electrically connected with the color film through the opening.

Similar to the first insulation layer 6, the second insulation layer 8 may be made from insulation materials such as silicon oxide, silicon nitride, hafnium nitride, resin. However, it may preferably be made from photo resist because the second insulation layer 8 may be patterned to form the first via hole 7. By means of the photosensitive property of the photo resist, use of the photo resist may be omitted in producing the opening 9.

Figure 14:
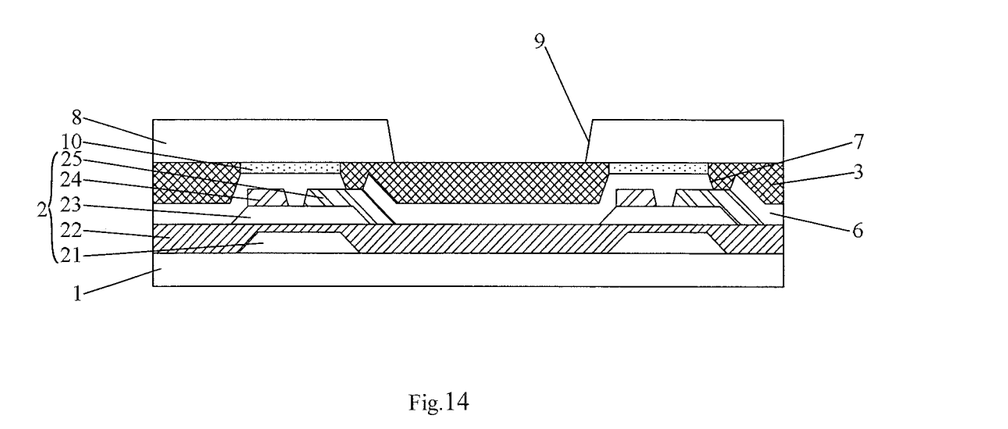
FIG. 14 is a eleventh schematic view of a structure of an array substrate according to an embodiment of the present invention.

In an embodiment of the present invention, the region to which the opening 9 corresponds is a light emitting region of the array substrate when it works. Meanwhile, the second insulation layer 8 remained around the opening 9 is a non-luminous region, as illustrated in FIG. 14. Therefore, the second insulation layer 8 is typically called as a pixel definition layer.

Step S302 of forming an organic layer on the color film and forming a conductive layer on the organic layer such that the color film contacts with the organic layer to drive the organic layer to emit the light in combination with the conductive layer.

Figure 15:
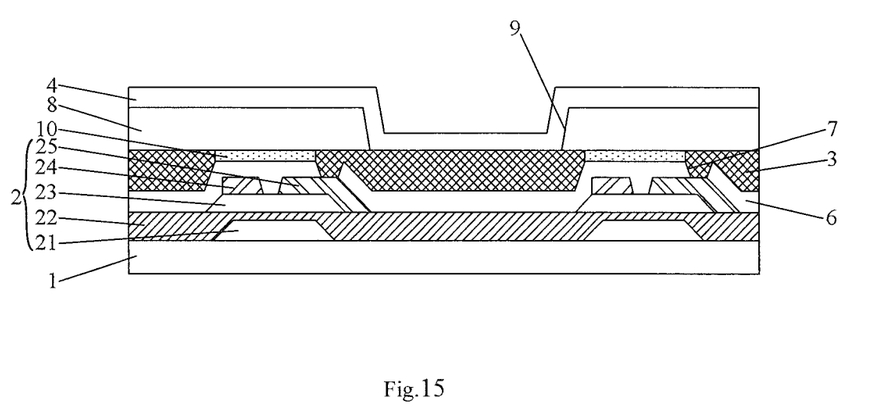
FIG. 15 is a twelfth schematic view of a structure of an array substrate according to an embodiment of the present invention.

After the Step S302, the structure of the array substrate is illustrated in FIG. 15.

In particular, the organic layer 4 may include a light emitting layer, may further comprise such as a cavity transmission layer, an electron transmission layer. For example, when a voltage between the color film 3 and the conductive layer 5 is suitable, the positive cavities in the cavity transmission layer bonds to the negative charges in the electron transmission layer in the light emitting layer such that the light emitting layer can produce luminance.

It should be noted that organic materials suitable for transmitting electrons may not be used to transmit cavities. Thus, the electron transmission layer and the cavity transmission layer of the organic light emitting diode may be made from different organic materials or organic materials doped with different impurities. At present, the materials that are often used to produce the electron transmission layer have high stability for producing films, high thermal stability and good electron transmission performance. Typically, the materials may be florescence dye compound, such as anthradiazole-based derivative, naphthalene-ring containing derivative, 1-naphthyl, 3-methylphenyl. However, the material of the cavity transmission layer belongs to aromatic amine florescence compound, such as organic materials, e.g., 1-naphthyl.

The material of the light emitting layer of the organic layer 4 must have the properties of strong florescence in solid state, good carrier transmission, thermal stability and chemical stability and high quantum efficiency and can be processed by vacuum vapor plating, for example, may be octohydroxyquinolinato aluminium.

In a preferable example, the light emitting layer may emit a white light.

Step S303 of forming a conductive layer on the organic layer.

On the array substrate shown in FIG. 15, the conductive layer 5 is formed by for example vapor plating or sputtering means. In an embodiment of the present invention, the conductive layer 5 driving the organic layer 4 to emit the light in combination with the color film 3 is made from opaque material with low costs and a smooth surface. It may prevent the light emitted from the organic layer 4 from exiting one side of the conductive layer 5 and avoid the reduction of utilization coefficient of light by the array substrate.

Further, if the light emitted from the organic layer 4 is white, the conductive layer is preferably made from white metal having a smooth surface, such as aluminum. It may prevent the light emitted from the organic layer 4 from producing color change after being reflected by the conductive layer 5 such that the display apparatus can have a desired display effect.

The color film in the array substrate produced by the method is made from transparent conductive resin. The color film in combination with the conductive layer drives the organic layer to emit the light. Thus, in the array substrate, the layer of metal anode may be omitted. Meanwhile, the planarization layer between the metal anode and the color film in the prior art may also be omitted. Thus, the layer arrangement of the array substrate may be simplified significantly. And as the layer arrangement of the array substrate is simplified, its processing flows and processing difficulty will be reduced, so as to improve the production yield of the array substrate.

Further, from the method for producing the array substrate shown in FIG. 8, other methods for producing the array substrates shown in FIGS. 2-4 may be derived as follows.

As an example, the array substrate shown in FIG. 2 is distinguished from that shown in FIG. 1 in that the thin film transistor unit 2 in FIG. 2 is of top gate type. Thus, from the producing steps shown in FIG. 8, the steps for producing the array substrate shown in FIG. 2 may be derived as follows:

The top gate type thin film transistor unit 2 has a structure almost in opposite to the bottom gate type thin film transistor unit shown in FIG. 1, that is, the top gate type thin film transistor unit 2 includes, from the bottom to the top: a source electrode 24 and the drain electrode 25 located on the same layer and insulated to each other, an active layer 23 connecting the source electrode 24 with the drain electrode 25, a gate insulation layer 22 and a gate electrode 21. Thus, the respective structures of the thin film transistor unit 2 including such as the drain electrode 25, the source electrode 24, the active layer 233, the gate insulation layer 22 and the gate electrode 21 need to be formed at first on the substrate base 1. Similarly, the drain electrode 25 and the source electrode 24 may be formed in the same layer or in different layers.

Then, the first insulation layer 6 is formed on the thin film transistor unit 2 and a black matrix 10 is formed on the first insulation layer 6 corresponding to the active layer 23. Then, in order that the color film 3 can be electrically connected with the drain electrode 25 located at the bottom layer, the first via hole 7 is formed on the first insulation layer 6 and the gate insulation layer 22. Finally, the colored transparent conductive resin forms the conductive color film 3. Meanwhile, the first via hole 7 is also filled with the color film such that the color film may be electrically connected with the drain electrode 25. To this end, the array substrate shown in FIG. 2 may be formed.

Obviously, as illustrated in FIGS. 1-2, the color films 3 are both located on the drain electrode 25. Similarly, it may be considered to use the producing method in a different order such that the color film 3 is located below the drain electrode 25.

As an example, as illustrated in FIG. 3, at first, the color film 3 is formed on the substrate base, and the first insulation layer 6 is formed on the color film 3. Then, the pattern including the drain electrode 25 of the thin film transistor unit 2 may be formed on the color film 3. The color film 3 is made from the transparent conductive resin and electrically connected with the drain electrode 25 of the thin film transistor unit 2.

Obviously, as the thin film transistor unit 2 is of bottom gate type in this case, the method for producing the thin film transistor unit 2 shown in FIG. 3 is similar to that for producing the thin film transistor unit 2 shown in FIG. 1. The details will be omitted below. It should be noted that, however, in order that the drain electrode 25 and the color film 3 may contact with each other, the gate insulation layer 22 and the first insulation layer 6 should be patterned, before the drain electrode 25 is formed, to form the first via hole 7 passing through the gate insulation layer 22 and the first insulation layer 6, and then the first via hole 7 is filled with the material of the drain electrode 25 when the drain electrode 25 is formed, so as to achieve the contact between the drain electrode 25 and the color film 3.

Similar to FIG. 3, the color film 3 in FIG. 4 is also located below the drain electrode 25 of the thin film transistor unit 2. And the array substrate in FIG. 4 must also be formed with the color film 3 at first, and then the pattern including the drain electrode 25 of the thin film transistor unit 2 is formed to achieve the contact between the color film 3 and the drain electrode 25. Different from FIG. 3, the thin film transistor unit 2 in FIG. 4 is of top gate type. Thus, the method for producing the thin film transistor unit 2 in FIG. 4 is similar to FIG. 2. The details will be omitted below. However, it should be noted that in the step for producing the array substrate in FIG. 4, the first via hole 7 needs to be formed on the first insulation layer 6 after the first insulation layer 6 is formed on the color film 3 such that the drain electrode 25 is in contact with the color film 3 while the drain electrode 25 is produced.

Similarly, the common electrode 13 cooperating with the color film 3 and the third insulation layer 11 between the color film 3 and the common electrode 13 may be added on the array substrates shown in the FIGS. 2-4. It may also form the ADS mode array substrate.

Further, similar to the steps shown in FIG. 12, the structures for example the second insulation layer 8, the organic layer 4 and the conductive layer 5 may be added on the array substrates shown in the FIGS. 2-4, so as to form the OLED mode array substrate. The details will be omitted.

Although several exemplary embodiments have been shown and described as above, the present invention is not limited to those and it would be appreciated by those skilled in the art that various changes or modifications may be made in these embodiments within the technical scope of the present disclosure. These changes or modifications will fall within the scope of the present invention. The scope of the present invention is defined in the claims and their equivalents.

What is claimed is:

1. An array substrate, comprising:
    a substrate base; and
    a thin film transistor unit and a color film on the substrate base,
    wherein the color film is conductive and electrically connected with a drain electrode of the thin film transistor unit;
    a first insulation layer between the color film and the drain electrode of the thin film transistor unit,
    wherein a first via hole is formed in a region of the first insulation layer corresponding to the drain electrode of the thin film transistor unit, and
    wherein the color film is electrically connected with the drain electrode through the first via hole.

2. The array substrate according to claim 1, further comprising:
    an organic layer and a conductive layer on the color film,
    wherein the color film in combination with the conductive layer drives the organic layer to emit a light.

3. The array substrate according to claim 2, further comprising:
    a second insulation layer on the color film,
    wherein the second insulation layer is provided with an opening thereon, the organic layer being electrically connected with the color film through the opening.

4. The array substrate according to claim 1, further comprising:
    a common electrode cooperating with the color film; and
    a third insulation layer between the color film and the common electrode.

5. The array substrate according to claim 1, wherein the color film is made from transparent conductive material.

6. The array substrate according to claim 5, wherein the color film is made of transparent conductive resin.

7. The array substrate according to claim 1, wherein the color film is separated electrically into a plurality of parts corresponding to pixel units respectively.

8. The array substrate according to claim 7, wherein the plurality of parts of the color film corresponding to pixel units respectively are insulated electrically by an insulation layer.

9. The array substrate according to claim 8, wherein the insulation layer is a black matrix.

10. A display apparatus comprising an array substrate according to claim 1.

11. A method for producing an array substrate, comprising:
    forming a pattern comprising a drain electrode of a thin film transistor unit and a conductive color film electrically connected with the drain electrode;
    forming a pattern comprising a drain electrode of a thin film transistor unit and a conductive color film electrically connected with the drain electrode comprises:
    forming the pattern comprising the drain electrode of the thin film transistor unit; and
    forming the color film on the formed drain electrode of the thin film transistor unit, the color film being electrically connected with the drain electrode of the thin film transistor unit;
    wherein before forming the color film on the drain electrode of the thin film transistor unit,
    forming a first insulation layer on the formed drain electrode of the thin film transistor unit and forming a first via hole in a region of the first insulation layer corresponding to the drain electrode of the thin film transistor unit,
    wherein the color film is electrically connected with the drain electrode through the first via hole.

12. The method according to claim 11, further comprising:
    forming an organic layer on the formed color film and forming a conductive layer on the organic layer,
    wherein the color film contacts with the organic layer and
    wherein the color film in combination with the conductive layer drives the organic layer to emit a light.

13. The method according to claim 12, further comprising, before forming the organic layer on the color film,
    forming a second insulation layer on the color film and forming an opening on the second insulation layer,
    wherein the organic layer is electrically connected with the color film through the opening.

14. A method for producing an array substrate, comprising:
    forming a pattern comprising a drain electrode of a thin film transistor unit and a conductive color film electrically connected with the drain electrode;
    forming a pattern comprising a drain electrode of a thin film transistor unit and a conductive color film electrically connected with the drain electrode comprises:
    forming the color film; and forming the pattern comprising the drain electrode of the thin film transistor unit on the color film, the color film being electrically connected with the drain electrode of the thin film transistor unit;
    wherein before forming the drain electrode of the thin film transistor unit on the color film,
    forming a first insulation layer on the color film and forming a first via hole in a region of the first insulation layer corresponding to the drain electrode of the thin film transistor unit,
    wherein the color film is electrically connected with the drain electrode through the first via hole.

* * * * *